United States Patent [19]

Nishiyama et al.

[11] 4,290,876
[45] Sep. 22, 1981

[54] SPUTTERING APPARATUS

[75] Inventors: Hiroshi Nishiyama, Mukou; Takeshi Nakamura, Uji; Suehiro Kato, Nagaokakyo; Kenji Ando, Kyoto, all of Japan

[73] Assignee: Murata Manufacturing Co., Ltd., Kyoto, Japan

[21] Appl. No.: 156,516

[22] Filed: Jun. 5, 1980

[51] Int. Cl.³ .............................................. C23C 15/00
[52] U.S. Cl. ................................ 204/298; 204/192 SP
[58] Field of Search ............. 204/192 R, 298, 197 SP, 204/192 PE

[56] References Cited

U.S. PATENT DOCUMENTS 4,209,375  6/1980  Gates .............................. 204/192 R

OTHER PUBLICATIONS

J. van Esdonk et al., "Joining a Sputter Target and a Backing Plate", Research/Development, Jan. 1975, pp. 41, 43–44.

Primary Examiner—Delbert E. Gantz
Assistant Examiner—William Leader
Attorney, Agent, or Firm—Birch, Stewart, Kolasch and Birch

[57] ABSTRACT

There is disclosed a combination of a target of a material other than metals and one of opposed electrodes of a sputtering apparatus for the deposition of thin films on substrates wherein the target is soldered on the electrodes by a low-melting alloy consisting essentially of a Pb-Sn-Zn alloy and at least one additive selected from the group consisting of Sb, Al, Ti, Si, Cd and Cu.

This target installation enables to prevent porous or poor heat-conducting targets from the breakage resulting from the increase of the film-forming rate or physical properties of the target material such as ceramics, glasses, resins and the like.

5 Claims, 2 Drawing Figures

SPUTTERING APPARATUS

BACKGROUND OF THE INVENTION

1. Field of the Invention

The present invention relates to sputtering apparatus for the deposition of thin films of a material other than metals on substrates. More particularly, it relates to a structure of a target installation of a sputtering apparatus, which is responsible for prevention of thermal breakage of a porous or poor heat-conducting target of a material, other than metals, during sputtering.

2. Description of the Prior Art

There are many sputtering systems such as, for example, diode DC sputtering systems, triode DC sputtering systems, radio-frequency sputtering systems which are used for producing a thin film on a substrate. In all of these sputtering systems, when producing thin films of a material other than metals, it is conventional to mount a target of a film-forming material on a cathode of a sputtering system by means of fittings, thereby making the target and the cathode come closely into contact with each other. However, such a structure of a target installation has serious problems awaiting a solution. For example, in the radio frequency sputtering systems the rate of forming thin films increases with an increase in an amount of the radio-frequency electric power supplied to the target so that it is customary to supply as much electric power as possible to increase the film-forming rate. However, the supply of a great amount of electric power frequently causes breakage of the target when the target is of a material other than metals such as, for example, ceramics, glasses, resins and the like. The breakage of the target results in the contamination of the thin films because the cathode is impacted by ions which are produced by a gaseous discharge and passed through cracks of the target, thereby ejecting the atoms of the cathode material.

It appears that one of the reasons why breakage of the target occurs during sputtering is the difference in temperature between the cathode and the target which occurs during sputtering for the following reasons. During sputtering, the target generates heat as a result of ion-bombardment, while the cathode is cooled by cooling water. Since the target, having the above material, is porous or poor heat-conducting and has poor heat-conductivity, its temperature is considerably increased. Accordingly, increasing the electricity supplied to such a porous or poor heat-conducting target results in a large temperature difference between the target and the cathode. Further, the heat generated by the ion bombardment makes the target expand so that the target would produce breakage when its thermal expansion force is greater than its tensile strength.

In order to overcome the above problem, it has been proposed to reinforce the porous or poor heat-conducting target by placing a solid reinforcing layer between the target and the cathode, which is formed by coating a paste or mixture of a binder and ceramic or glass powder on one surface of the target to be in contact with the cathode, and then heat-treating the paste. However, it is difficult with such a reinforcing layer to avoid the breakage of the target.

SUMMARY OF THE INVENTION

It is therefore an object of the present invention to provide a structure of a target installation in a sputtering apparatus for the deposition of thin films of a material other than metals, such as ceramics, glasses, resins and the like, or substrates, which presents a porous or poor heat-conducting target from breaking during sputtering.

According to the present invention, there is provided a sputtering apparatus for the deposition of thin films of a material other than metals on substrates, comprising a pair of opposed electrodes one of which is adapted to mount a substrate wherein a target of a material other than metals from which thin-film-forming atoms are ejected by ion-bombardment during sputtering is soldered on the other electrode by a low-melting alloy consisting essentially of a Pb-Sn-Zn alloy and at least one additive selected from the group consisting of Sb, Al, Ti, Si, Cd, and Cu having high affinity for oxygen.

The above low-melting alloy generally consists essentially of 5 to 98% of Pb, 1.8 to 94.4% of Sn, 0.05 to 10% of Zn and 0.05 to 10% of the above at least one additive. A preferred low-melting alloy has a composition consisting essentially of 5 to 80% of Pb, 19.4 to 94.4% of Sn, 0.5 to 3.5% of Cu and 0.1 to 1.5% of Zn. Another preferred low-melting alloy has a composition consisting essentially of 40 to 98% of Pb, 1.8 to 50% of Sn, 0.05 to 10% of Zn and 0.05 to 10% of Sb. Still another preferred low-melting alloy has a composition 40 to 98% of Pb, 1.8 to 50% of Sn, 0.05 to 10% of Zn, 0.05 to 10% of Sb and 0.1 to 0.1% of Al.

In order to improve the adhesion strength between the target and the electrode, it is preferred to form a metallized layer of a Cr-Au alloy or Ti-Au alloy on one or both sides to be bonded together of the target and cathode before soldering the target on the electrode with the low-melting alloy. The metallized layer of the Cr-Au alloy or Ti-Au alloy may be formed by the known sputtering method or vapour-deposition method.

According to the present invention, it is possible to prevent porous or poor heat-conducting targets from the breakage resulting from the increase of the film-forming rate or physical properties of the target material. Also, there is no contamination of the produced thin films.

BRIEF DESCRIPTION OF THE DRAWINGS

The invention together with other objects, features and advantages thereof will be further understood by referring to the following description taken in conjunction with the accompanying drawings; wherein.

DETAILED DESCRIPTION OF THE INVENTION

Figure 1:
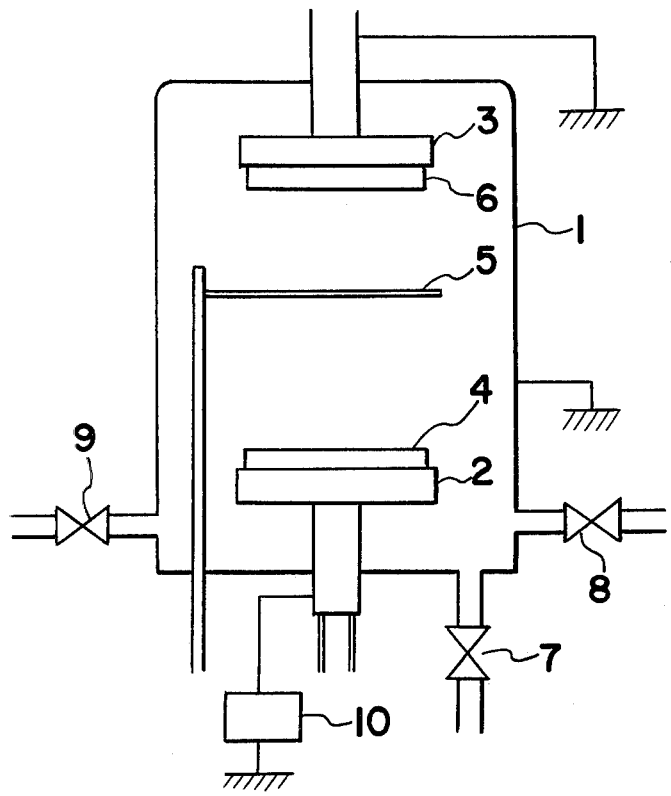
FIG. 1 is a schematic diagram showing a general construction of a radio-frequency sputtering apparatus applied with the present invention.

Referring now to FIG. 1 there is shown a high-rate radio-frequency diode sputtering apparatus which comprises a bell jar 1, a pair of opposed electrodes, i.e., a planar cathode 2 and a planar anode 3 parallelly arranged therein, and a shutter 5 positioned between the electrodes. The bell jar 1 is provided with vents 7 and 8 which are respectively connected to a vacuum pump (not shown) and an inlet 9 for an ionizable medium such as oxygen gas, nitrogen gas, argon gas and the like. The gas inlet 9 is connected to a ionizable medium source (not shown). The anode 3 and the bell jar 1 are grounded. One terminal of a radio-frequency electric power source 10 of 13.5 MHz is electrically connected to the cathode 2 and the other terminal is grounded. A radio-frequency voltage is applied therefrom between the cathode 2 and the anode 3. A porous or poor heat-conducting target 4 of a material other than metals is mounted on the cathode 2 in the manner described below in accordance with the present invention. A substrate 6 on which a thin film is formed is mounted on the anode opposite to the target 4 in the conventional manner, and heated to a temperature ranging from 200° to 500° C. during sputtering.

Figure 2:
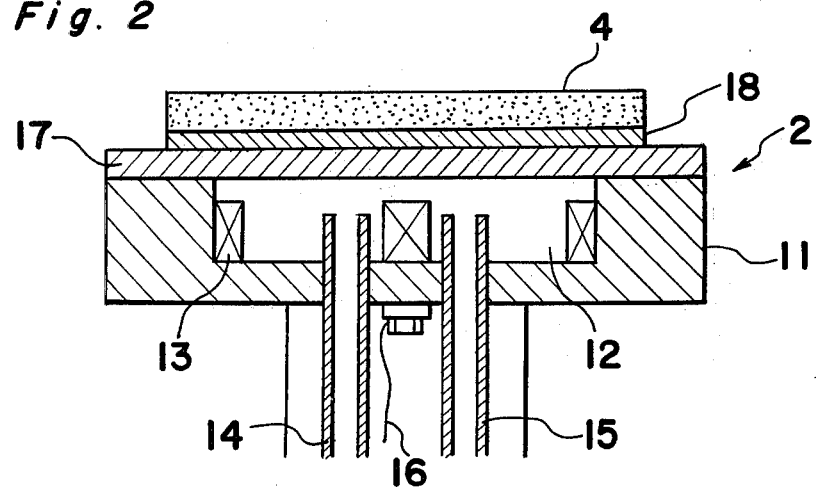
FIG. 2 is an enlarged view of FIG. 1 showing an essential part of the present invention.

Referring now to FIG. 2, the cathode 2 is composed of a cathode body 11 with an annular recess 12 provided therein, and a cathode plate 17 on which a disc-shaped target 4 of a material other than metals, such as ceramics, glasses, resins and the like is soldered by means of a low-melting alloy 18. An annular magnet 13 is arranged in the recess 12 of the cathode body 11. The cathode body 11 is also provided with inlet and outlet pipes 14 and 15 so that cooling water is fed into the recess 12 through the inlet pipe 14 and drawn therefrom through the outlet pipe 15.

The target 4 may be mounted on the cathode plate 17 by placing the low-melting alloy layer 18 between them in the following manner. For example, a low-melting alloy is rubbed into adherends, i.e., one surface of the target 4 to be fixed on the cathode plate 17 and the surface of the cathode plate 17. Then the target 4 is placed on the cathode plate 17 so that the surface of the target 4, with a rubbed low-melting alloy is in contact with the surface of the cathode plate 17. After that, the target 4 is heated under the application of a pressure to liquidify the low-melting alloy, and then cooled to solidify the same, thereby fixing the target on the cathode plate 17.

Fixing of the target 4 on the cathode plate 17 may be carried out by applying heat together with ultrasonic vibration onto the low-melting alloy present between the target 4 and the cathode plate 17.

The apparatus may be operated, for example, in the following manner. The bell jar 1, after being rendered airtight, is evacuated by a conventional vacuum pump through the vents 7 and 8 to more than $1 \times 10^{-6}$ Torr. An ionizable medium such as argon or oxygen or mixture therefore is introduced into the bell jar 1 through the gas inlet 9, thereby adjusting the pressure in the bell jar to $1 \times 10^{-1}$ to $10^{-4}$ Torr. A radio-frequency voltage is applied to the cathode 2 from the radio-frequency electric power source 10 to discharge electricity between the cathode 2 and the anode 3, thereby effecing the ionization of the ionizable medium. The ions of the medium impact the target so that atoms of the film-forming material are ejected from the surface of the target 4 as a result of the ion bombardment and deposited on the substrate 6 to form a thin film.

EXAMPLE 1

Using a low-melting alloy consisting of 50% of Pb, 46% of Sn, 3% of Zn and 1% of Cu, a disc-shaped ceramic target with a 150 mm diameter and a 6 mm thickness was mounted on the cathode plate 17, and the sputtering was carried out in the manner described the above. The ceramic target consists of 99% of ZnO and 1% of Cu. The breakage of this porous target was never observed even when a radio-frequency electric power was supplied to the target in an amount of 7 to 8 w/cm². No contamination of the produced thin film was observed.

In contrast therewith, a ceramic target having the same composition and the same dimension as that of target of above example has, and being mounted in the conventional manner, produced the breakage at an electric power of 1.7 to 2.2 w/cm².

EXAMPLE 2

Using a low-melting alloy consisting of 81% of Pb, 91% of Sn, 6% of Zn and 4% of Sb, a disc-shaped ceramic target the same as that used in Example 1 was mounted on the cathode plate, and the sputtering was carried out in the same manner described the above. There were obtained good results similar to those obtained in Example 1.

EXAMPLE 3

Using a low-melting alloy consisting of 93% of Pb, 4% of Sn, 2% of Zn, 1% of Sb and 0.05% of Al a disc-shaped ceramic target same as used in Example 1 was mounted on the cathode plate and the sputtering was carried out in the manner described the above. There were obtained good results similar to those obtained in Example 1

The reason why the porous or poor heat-conducting target fixed in accordance with the present invention produces no breakage even at a high electric power is that the provision of a low-melting alloy layer 18 between the cathode 4 and the target enhances the heat conduction and absorbs the difference in thermal-expansion between the target and the cathode.

In the foregoing, the present invention has been described in connection with a diode radio-frequency sputtering apparatus, but it will be apparent that the present invention may be applied to any other sputtering apparatus such as, for example, diode DC sputtering apparatus, triode DC sputtering apparatus, magnetron sputtering apparatus, reactive sputtering apparatus, biasing sputtering apparatus and the like.

Further, the present invention may be applied to any other target material such as glasses, synthetic resins and the like.

What we claim is:
1. A sputtering apparatus for the deposition of non-metallic thin-films on substrates, comprising:
   a pair of opposed electrodes;
   a substrate layer mounted on one of said electrodes;
   a target layer of a non-metallic material mounted on the other of said pair of electrodes, said target layer comprising ZnO;
   a low temperature melting alloy layer interposed between said target layer and the other of said pair of electrodes for soldering said target layer to said other of said pair of electrodes, said low temperature melting alloy layer including Pb, Sn, and Zn, and further including at least one additive selected from the group consisting of Sb, Al, Ti, Si, Cd and Cu.

2. The combination according to claim 1 wherein said low-melting alloy layer consists essentially of 5 to 98% of Pb, 1.8 to 94.4% of Sn, 0.05 to 10% of Zn and 0.05 to 10.0% of said at least one additive.

3. The combination according to claim 1 wherein said low-melting alloy layer consists essentially of 5 to 80% of Pb, 19.4 to 94.4% of Sn, 0.1 to 1.5% of Zn and 0.5 to 3.5% of Cu.

4. The combination according to claim 1 wherein said low-melting alloy layer consists essentially of 40 to 98% of Pb, 1.8 to 50% of Sn, 0.05 to 10% of Zn, and 0.05 to 10% of Sb.

5. The combination according to claim 1 wherein said low-melting alloy layer consists essentially of 40 to 98% of Pb, 1.8 to 50% of Sn, 0.05 to 10% of Zn, 0.05 to 10% of Sb, and 0.01 to 0.1% of Al.

* * * * *